United States Patent
Choi et al.

(10) Patent No.: US 11,489,442 B2
(45) Date of Patent: Nov. 1, 2022

(54) POWER CONVERSION DEVICE AND METHOD

(71) Applicant: Samsung Electronics Co., Ltd., Gyeonggi-do (KR)

(72) Inventors: Kyusik Choi, Gyeonggi-do (KR); Yunhui Han, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 174 days.

(21) Appl. No.: 16/966,684

(22) PCT Filed: Feb. 14, 2019

(86) PCT No.: PCT/KR2019/001806
§ 371 (c)(1),
(2) Date: Jul. 31, 2020

(87) PCT Pub. No.: WO2019/164181
PCT Pub. Date: Aug. 29, 2019

(65) Prior Publication Data
US 2021/0036607 A1  Feb. 4, 2021

(30) Foreign Application Priority Data

Feb. 22, 2018 (KR) .................. 10-2018-0021347

(51) Int. Cl.
*H02M 3/07* (2006.01)
*G11C 5/14* (2006.01)
*H02M 1/00* (2006.01)

(52) U.S. Cl.
CPC .............. *H02M 3/07* (2013.01); *G11C 5/14* (2013.01); *H02M 1/0095* (2021.05)

(58) Field of Classification Search
CPC .......... H02M 1/0095; H02M 3/07; G11C 5/14
See application file for complete search history.

(56) References Cited

U.S. PATENT DOCUMENTS

2006/0028849 A1  2/2006  Ogata et al.
2008/0239772 A1  10/2008  Oraw et al.
(Continued)

FOREIGN PATENT DOCUMENTS

JP   2003-284324 A   10/2003
JP   2007-58845 A    3/2007
(Continued)

OTHER PUBLICATIONS

European Search Report dated Feb. 15, 2021.
(Continued)

*Primary Examiner* — Jue Zhang
(74) *Attorney, Agent, or Firm* — Cha & Reiter, LLC

(57) ABSTRACT

Various embodiments according to the present invention relate to a power conversion device and method, the device comprising: a converter; a capacitor unit including a plurality of capacitors for storing input voltage input thereto; a switch unit connected to the capacitor unit and including a plurality of switches for selectively connecting at least one capacitor among the plurality of capacitors to the converter; and a controller connected to the capacitor unit and the switch unit, wherein the controller determines at least one capacitor satisfying a specified condition, among the plurality of capacitors, sets at least one switch among the plurality of switches to be turned on, the at least one switch corresponding to the at least one capacitor, and sets at least another switch among the plurality of switches except for the at least one switch, to be turned off, so that the at least one capacitor and the converter are electrically connected and configured to allow at least partial voltage of the input voltage, stored in the at least one capacitor, to be supplied to the converter. Therefore, a power conversion device, disposed on a circuit on which the plurality of capacitors (or cells) is connected in series to a power supply unit, can
(Continued)

establish selective connection by using the switch unit, so as to adjust input voltage and provide the adjusted input voltage to the converter, and can reduce switching loss of the power conversion device. Various other embodiments are possible.

11 Claims, 13 Drawing Sheets

(56) References Cited

U.S. PATENT DOCUMENTS

| | | | | |
|---|---|---|---|---|
| 2008/0304301 | A1* | 12/2008 | Nishio | H02M 7/487 363/132 |
| 2009/0278520 | A1* | 11/2009 | Perreault | H02M 3/158 323/282 |
| 2011/0154068 | A1 | 6/2011 | Huang et al. | |
| 2012/0200163 | A1 | 8/2012 | Ito et al. | |
| 2012/0313602 | A1 | 12/2012 | Perreault et al. | |
| 2013/0201742 | A1 | 8/2013 | Nabeto et al. | |
| 2019/0190376 | A1 | 6/2019 | Xiong et al. | |
| 2020/0328675 | A1 | 10/2020 | Seo et al. | |

FOREIGN PATENT DOCUMENTS

| | | |
|---|---|---|
| JP | 2009-89568 A | 4/2009 |
| WO | 2017-210340 A1 | 12/2017 |
| WO | 2018-023695 A1 | 2/2018 |

OTHER PUBLICATIONS

Villar-Pique, Gerard; Survey and Benchmark of Fully Integrated Switching Power Converters: Switched-Capacitor Versus Inductive Approach, pp. 4156-4167.

* cited by examiner

POWER CONVERSION DEVICE AND METHOD

CROSS-REFERENCE TO RELATED APPLICATION(S)

This application is a National Phase Entry of PCT International Application No. PCT/KR2019/001806, which was filed on Feb. 14, 2019 and claims priority to Korean Patent Application No. 10-2018-0021347, which was filed on Feb. 22, 2018, the contents of which are incorporated herein by reference.

TECHNICAL FIELD

Various embodiments of the disclosure relate to a power conversion device and method.

BACKGROUND ART

An electronic device, such as a portable terminal, uses a power conversion device to supply operating power required for the operation of internal devices (e.g., a processor, a memory, and the like).

The power conversion device may convert a voltage supplied from a battery into a voltage suitable for the internal devices of the electronic device.

The power conversion device includes a buck converter for stepping down an input power, a booster converter for stepping up an input power, and the like.

DETAILED DESCRIPTION OF INVENTION

Technical Problem

A buck converter, which is a kind of the power conversion device, is necessarily required to have an inductor, and thus the power conversion device may become expensive and bulky.

In addition, as the difference between an input voltage and an output voltage becomes larger, the buck converter requires an inductor having a large capacity.

In addition, since the difference between the input voltage and the output voltage of the buck converter is large, the buck converter may have high power loss and low efficiency.

Various embodiments of the disclosure may provide a power conversion device and method which can selectively connect a switch unit to adjust an input voltage and provide the input voltage to a converter in a circuit in which a plurality of capacitors (or cells) are connected in series to a power supply unit.

Solution to Problem

A power conversion device according to various embodiments of the disclosure may include: a converter; a capacitor unit including a plurality of capacitors for accumulating an input voltage which is input thereto; a switch unit connected to the capacitor unit and including a plurality of switches for selectively connecting at least one capacitor among the plurality of capacitors to the converter; and a controller connected to the capacitor unit and the switch unit, wherein the controller is configured to determine at least one capacitor satisfying a specified condition, among the plurality of capacitors, set at least one switch among the plurality of switches, to be turned on, the at least one switch corresponding to the at least one capacitor, and set at least a part of the other switches except for the at least one switch among the plurality of switches, to be turned off, so that the at least one capacitor and the converter are electrically connected and at least a part of the input voltage accumulated in the at least one capacitor is supplied to the converter.

An electronic device according to various embodiments of the disclosure may include: a converter; a power supply unit; a capacitor unit including a plurality of capacitors for accumulating an input voltage which is input through the power supply unit; a switch unit connected to the capacitor unit and including a plurality of switches for selectively connecting at least one capacitor among the plurality of capacitors to the converter; and a controller connected to the capacitor unit and the switch unit, wherein the controller is configured to determine at least one capacitor satisfying a specified condition, among the plurality of capacitors, set at least one switch among the plurality of switches, to be turned on, the at least one switch corresponding to the at least one capacitor, and set at least a part of the other switches except for the at least one switch among the plurality of switches, to be turned off, so that the at least one capacitor and the converter are electrically connected and at least a part of the input voltage accumulated in the at least one capacitor is supplied to the converter.

A power conversion method according to various embodiments of the disclosure may include: determining, by a controller, an input voltage required for a converter; determining, by the controller, at least a part of a plurality of capacitors in order to supply a voltage required for the converter; selecting, by the controller, a capacitor satisfying a specified voltage, among the determined at least a part of the capacitors; setting, by the controller, a power path for supplying power to the converter with respect to a capacitor selected through a switch unit; and supplying power to the converter by using a switch which is turned on according to the setting of the power path.

Advantageous Effects of Invention

According to various embodiments of the disclosure, in a circuit in which a plurality of capacitors (or cells) are connected in series to a power supply unit, a switch unit is selectively connected to adjust an input voltage and provide the input voltage to a converter, so that switching loss of a power conversion device can be reduced.

Various embodiments of the disclosure can provide a power conversion device which does not require an inductor and is thus inexpensive and has a small volume.

Various embodiments of the disclosure can provide a power conversion device and method, which provide a most suitable input voltage for a converter, so as to minimize the difference between an input voltage and an output voltage, so that the power conversion device has low power loss and high efficiency.

MODE FOR THE INVENTION

Figure 1:
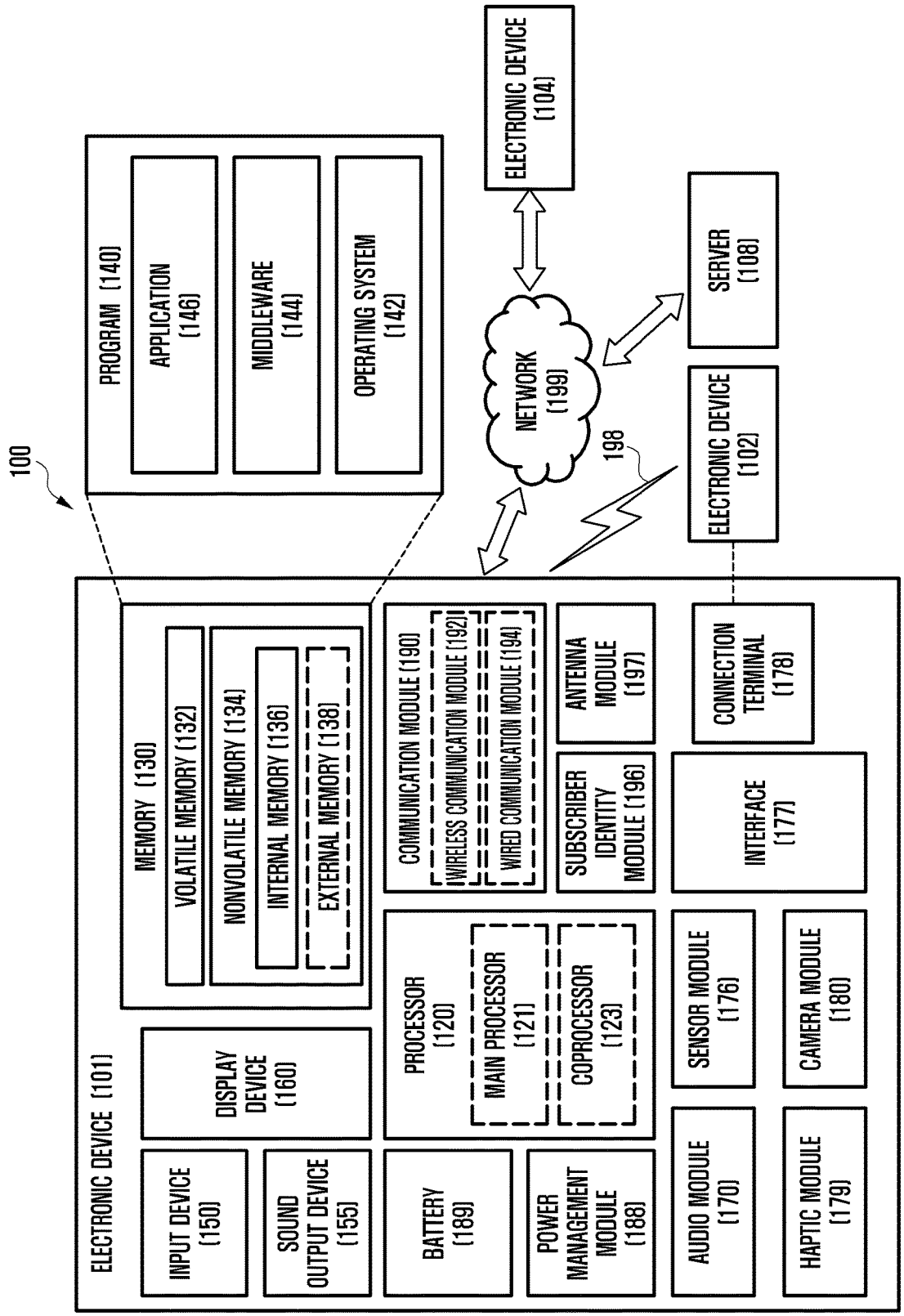
FIG. 1 is a block diagram of an electronic device in a network environment, according to various embodiments of the disclosure.

FIG. 1 is a block diagram illustrating an electronic device 101 in a network environment 100 according to certain embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform certain data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store certain data used by at least one component (e.g., the processor 120 or the sensor module 176) of the electronic device 101. The certain data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These certain types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit/receive a signal or power to/from an external entity (e.g., an external electronic device). According to some embodiments, the antenna module 197 may be formed of a conductor or a conductive pattern and may further include any other component (e.g., RFIC). According to an embodiment, the antenna module 197 may include one or more antennas, which may be selected to be suitable for a communication scheme used in a specific communication network, such as the first network 198 or the second network 199 by, for example, the communication module 190. Through the selected at least one antenna, a signal or power may be transmitted or received between the communication module 190 and the external electronic device.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to certain embodiments may be one of certain types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include certain changes, equivalents, or replacements for a corresponding embodiment.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

The module or programming module of the present disclosure may include at least one of the aforementioned components with omission of some components or addition of other components. The operations of the modules, programming modules, or other components may be executed in series, in parallel, recursively, or heuristically. Also, some operations may be executed in different order, omitted, or extended with other operations.

Figure 2:
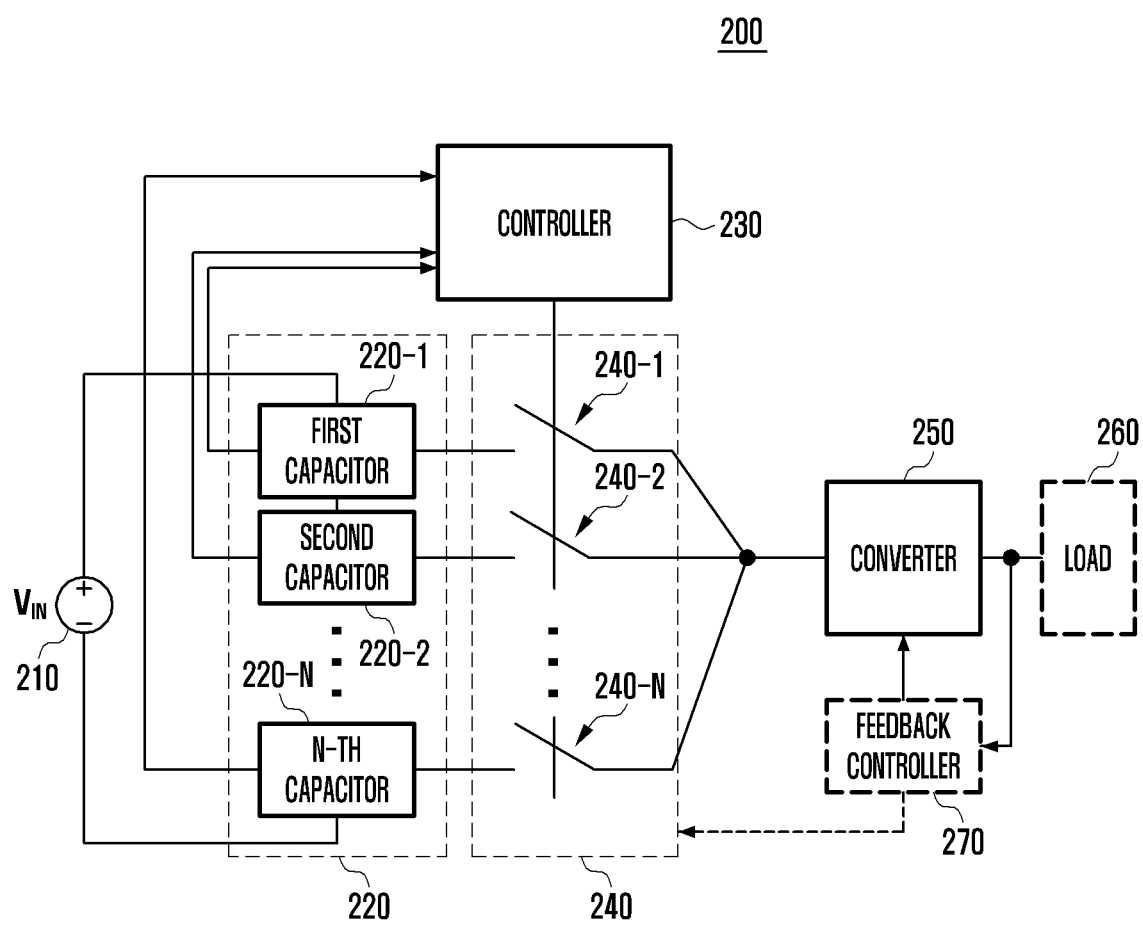
FIG. 2 schematically illustrates a configuration of a power conversion device according to various embodiments of the disclosure.

FIG. 2 schematically illustrates a configuration of a power conversion device according to various embodiments of the disclosure.

Referring to FIG. 2, a power conversion device 200 (e.g., the power management module 188 of FIG. 1) according to various embodiments of the disclosure may include a power supply unit 210 (e.g., the battery 189 of FIG. 1), a capacitor unit 220, a controller 230 (e.g., the processor 120 of FIG. 1), a switch unit 240, a converter 250, a load 260, and a feedback controller 270.

The power supply unit 210 may supply a direct current (DC) voltage to the capacitor unit 220 and the converter 250 through power terminals (+, −). According to an embodiment, the power supply unit 210 may include a battery (e.g., the battery 189 of FIG. 1) which supplies a direct current voltage of a predetermined level. According to an embodiment, the power supply unit 210 may be an external power source or an internal power source of the power conversion device 200.

The capacitor unit 220 may accumulate, for example, a voltage supplied from the power supply unit 210. According to an embodiment, the capacitor unit 220 may include a plurality of capacitors (e.g., a first capacitor 220-1, a second capacitor 220-2, . . . , and an N-th capacitor 220-N). The plurality of capacitors may be connected in series to the power supply unit 210. Each of the plurality of capacitors may supply a voltage of a different level to the converter 250. According to an embodiment, since the sum of the voltages of the plurality of capacitors (e.g., the first capacitor 220-1, the second capacitor 220-2, . . . , and the N-th capacitor 220-N) is always maintained as an input voltage, when a voltage is supplied to the converter 250 from a capacitor selected through switching of the switch unit 240, a voltage of the selected capacitor is lowered, and a voltage of a capacitor which is not selected is increased, so that energy can be stored.

The controller 230 may be connected to each of the first capacitor 220-1, the second capacitor 220-2, . . . , and the N-th capacitor 220-N. The controller 230 may determine on/off of the switch unit 240 so as to supply a designated input voltage to the converter 250. According to an embodiment, the controller 230 may control an input path of the converter 250 through the switch unit 240 such that a voltage of each of the first capacitor 220-1, the second capacitor 220-2, . . . , and the N-th capacitor 220-N is maintained within a predetermined range.

The switch unit 240 may be switched on or off according to a control of the controller 230. The switch unit 240 may be turned on/off to selectively supply, to the converter 250, a voltage accumulated in each of the first capacitor 220-1, the second capacitor 220-2, . . . , and the N-th capacitor 220-N of the capacitor unit 220. According to an embodiment, the switch unit 240 may include a first switch 240-1, a second switch 240-2, . . . , and an N-th switch 240-N which correspond to the first capacitor 220-1, the second capacitor 220-2, . . . , and the N-th capacitor 220-N, respectively.

The converter 250 may be selectively supplied with a voltage from the first capacitor 220-1, the second capacitor 220-2, . . . , and the N-th capacitor 220-N of the capacitor unit 220 according to on/off of the switch unit 240. The converter 250 may output, to the load 260, a voltage stepped-down below a voltage which is input. According to an embodiment, the converter 250 may include a buck converter or a direct current-direct current (DC-DC) converter.

The feedback controller 270 may provide a feedback signal to at least one of the converter 250 or the switch unit 240, based on a voltage of a terminal of the load 260. According to various embodiments, the feedback controller 270 and the load 260 are not essential components, and may be selectively configured.

According to an embodiment, at least one of the converter 250, the load 260, and the feedback controller 270 may be configured in parallel to the switch unit 240. According to an embodiment, at least one converter 250 may be configured in parallel to the switch unit 140.

Figure 3:
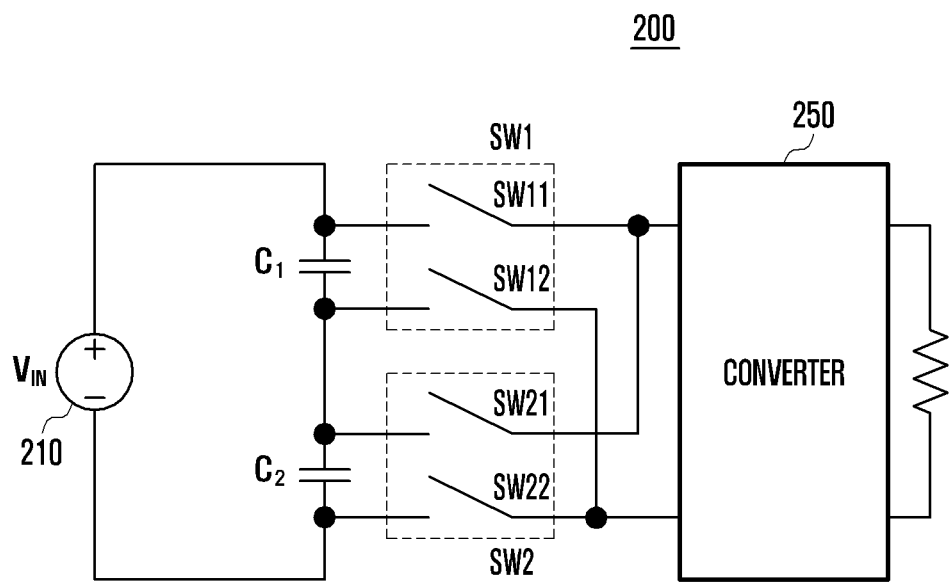
FIG. 3 schematically illustrates a configuration of an example of a power conversion device according to various embodiments of the disclosure.
Figure 4:
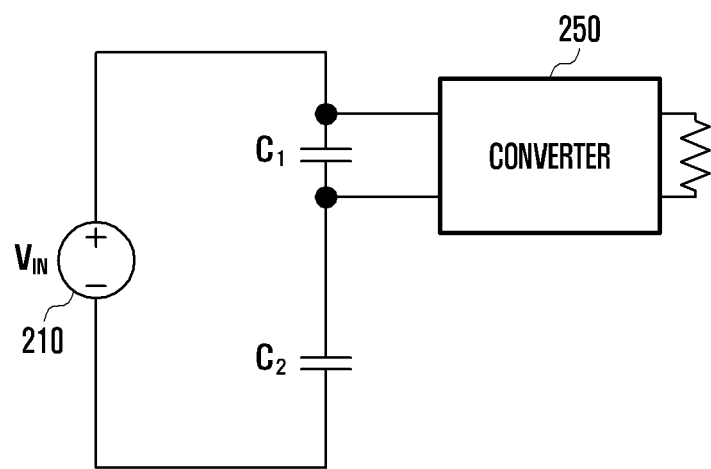
FIG. 4 illustrates a case in which a voltage of a first capacitor $C_1$ is greater than a voltage of a second capacitor $C_2$ (VC1>VC2) in a power conversion device configured as in FIG. 3.
Figure 5:
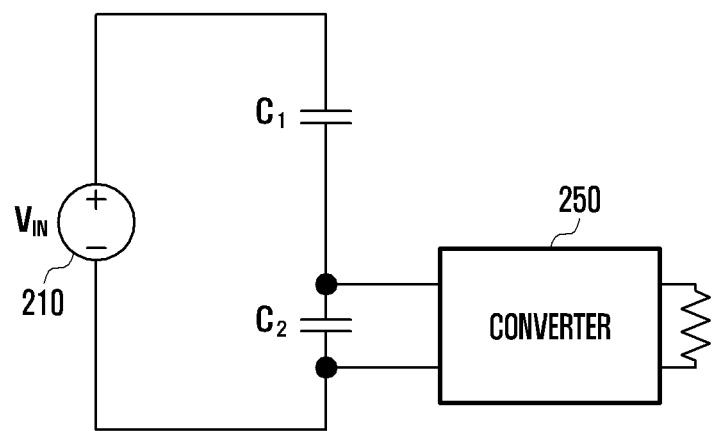
FIG. 5 illustrates a case in which a voltage of a first capacitor $C_1$ is less than a voltage of a second capacitor $C_2$ (VC1<VC2) in a power conversion device configured as in FIG. 3.

FIG. 3 schematically illustrates a configuration of an example of a power conversion device according to various embodiments of the disclosure. FIG. 4 illustrates a case in which a voltage of a first capacitor $C_1$ is greater than a voltage of a second capacitor $C_2$ (VC1>VC2) in a power conversion device configured as in FIG. 3. FIG. 5 illustrates a case in which a voltage of a first capacitor $C_1$ is less than a voltage of a second capacitor $C_2$ (VC1<VC2) in a power conversion device configured as in FIG. 3.

Referring to FIG. 3, the power conversion device 200 according to various embodiments of the disclosure may include the power supply unit 210, two capacitors (e.g., a first capacitor $C_1$ and a second capacitor $C_2$), two switches (e.g., a first switch SW1 and a second switch SW2), and the converter 250.

The first capacitor $C_1$ and the second capacitor $C_2$ may be connected in series to the power supply unit 210.

The first switch SW1 may include a (1-1)th switch SW11 and a (1-2)th switch SW12 which are connected to both ends of the first capacitor $C_1$, respectively. The second switch SW2 may include a (2-1)th switch SW21 and a (2-2)th switch SW22 which are connected to both ends of the second capacitor $C_2$, respectively.

The converter 250 may be connected to each of the first switch SW1 and the second switch SW2.

According to an embodiment, in a case where a voltage of the first capacitor $C_1$ is greater than a voltage of the second capacitor $C_2$ (VC1>VC2) in the power conversion device 200 of FIG. 3, the first switch SW1 may be connected. In this case, as illustrated in FIG. 4, power supplied through the power supply unit 210 may be supplied to the converter 250 through the first capacitor $C_1$.

According to an embodiment, in a case where a voltage of the first capacitor $C_1$ is less than a voltage of the second capacitor $C_2$ (VC1<VC2) in the power conversion device 200 of FIG. 3, the second switch SW2 may be connected. In this case, as illustrated in FIG. 5, power supplied through the power supply unit 210 may be supplied to the converter 250 through the second capacitor $C_2$.

Figure 6:
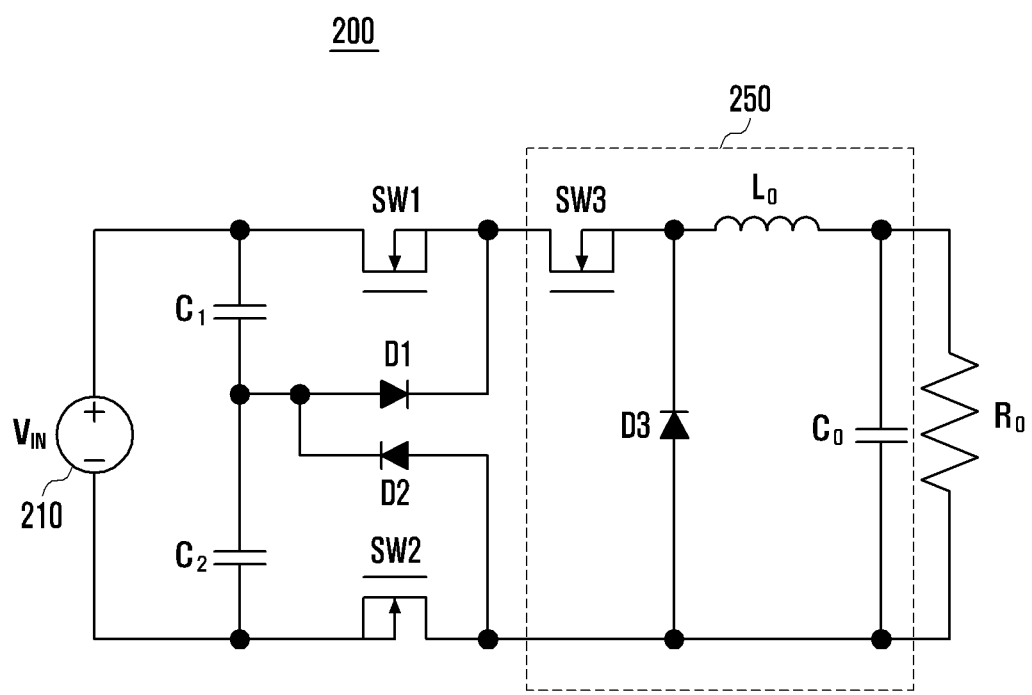
FIG. 6 illustrates a configuration of another example of a power conversion device according to various embodiments of the disclosure.

FIG. 6 illustrates a configuration of another example of a power conversion device according to various embodiments of the disclosure.

Referring to FIG. 6, the power conversion device 200 according to various embodiments of the disclosure may include two capacitors (e.g., the first capacitor $C_1$ and the second capacitor $C_2$), two switches (e.g., the first switch SW1 and the second switch SW2), a first diode D1, a second diode D2, and the converter 250.

The first capacitor $C_1$ and the second capacitor $C_2$ may be connected in series to the power supply unit 210.

The first switch SW1 may be connected to the first capacitor $C_1$. The second switch SW2 may be connected to the second capacitor $C_2$. According to an embodiment, each of the first switch SW1 and the second switch SW2 may include at least one of a metal-oxide semiconductor field-effect-transistor (MOSFET), a field effect transistor (FET), and a transistor (TR).

The first diode D1 may be connected between the first switch SW1 and a contact point between the first capacitor $C_1$ and the second capacitor $C_2$. According to an embodiment, an anode of the first diode D1 may be connected to the contact point between the first capacitor $C_1$ and the second capacitor $C_2$, and a cathode of the first diode may be connected to the first switch SW1.

The second diode D2 may be connected between the second switch SW2 and the contact point between the first capacitor $C_1$ and the second capacitor $C_2$. According to an embodiment, a cathode of the second diode D2 may be connected to the contact point between the first capacitor $C_1$ and the second capacitor $C_2$, and an anode of the second diode may be connected to the second switch SW2.

The converter 250 may include a third switch SW3, an inductor $L_0$, a third capacitor $C_0$, and a third diode D3. The converter 250 may be configured as a buck converter. The converter 250 may be connected to the first switch SW1 and the second switch SW2.

The third switch SW3 may perform a switching operation of the converter 250 for power supplied through the first capacitor $C_1$ or the second capacitor $C_2$ according to on/off of the first switch SW1 and the second switch SW2.

The inductor $L_0$ may be connected to the third switch SW3. The third capacitor $C_0$ may be connected between the inductor $L_0$ and the second switch SW2. The third capacitor $C_0$ may be connected to the inductor $L_0$. According to an embodiment, the inductor $L_0$ and the third capacitor $C_0$ may accumulate a charge supplied through the first capacitor $C_1$ or the second capacitor $C_2$ according to a switching operation of the third switch SW3.

A cathode of the third diode D3 may be connected to the third switch SW3, and an anode of the third diode may be connected to the second switch SW2. The third diode D3 may be connected to the third switch SW3. According to an embodiment, the third diode D3 may form a loop between the inductor $L_0$ and the third capacitor $C_0$ according to the switching operation of the third switch SW3.

According to various embodiments, at least one converter 250 may be connected in parallel to the first switch SW1 or the second switch SW2.

Figure 7:
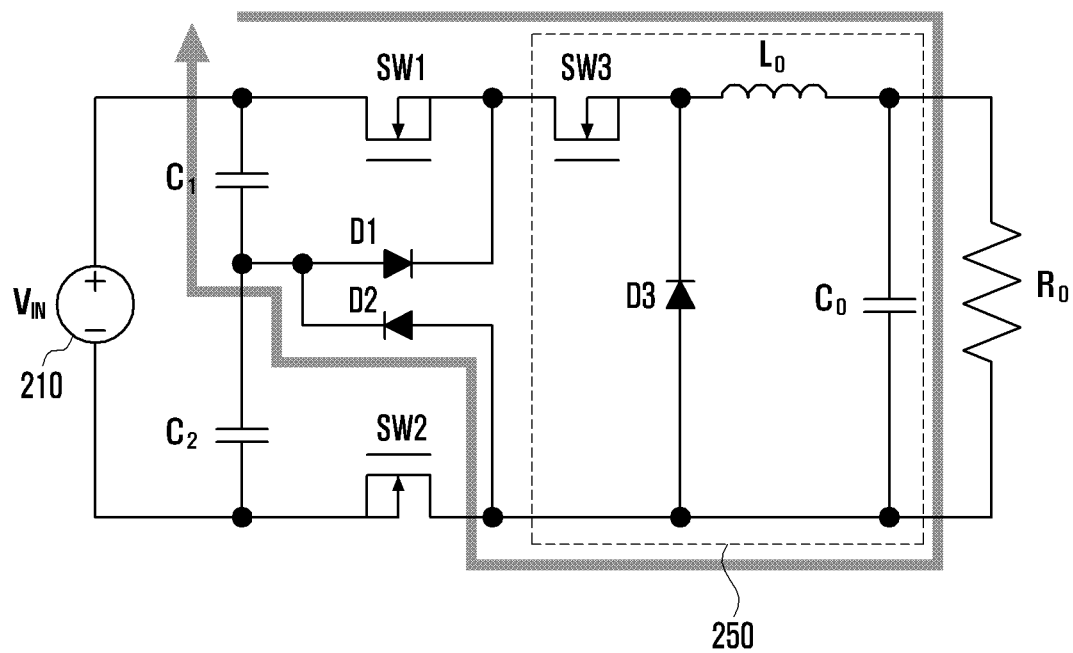
FIG. 7 illustrates a case in which a voltage of a first capacitor $C_1$ is greater than a voltage of a second capacitor $C_2$ (VC1>VC2) in a power conversion device configured as in FIG. 6.
Figure 8:
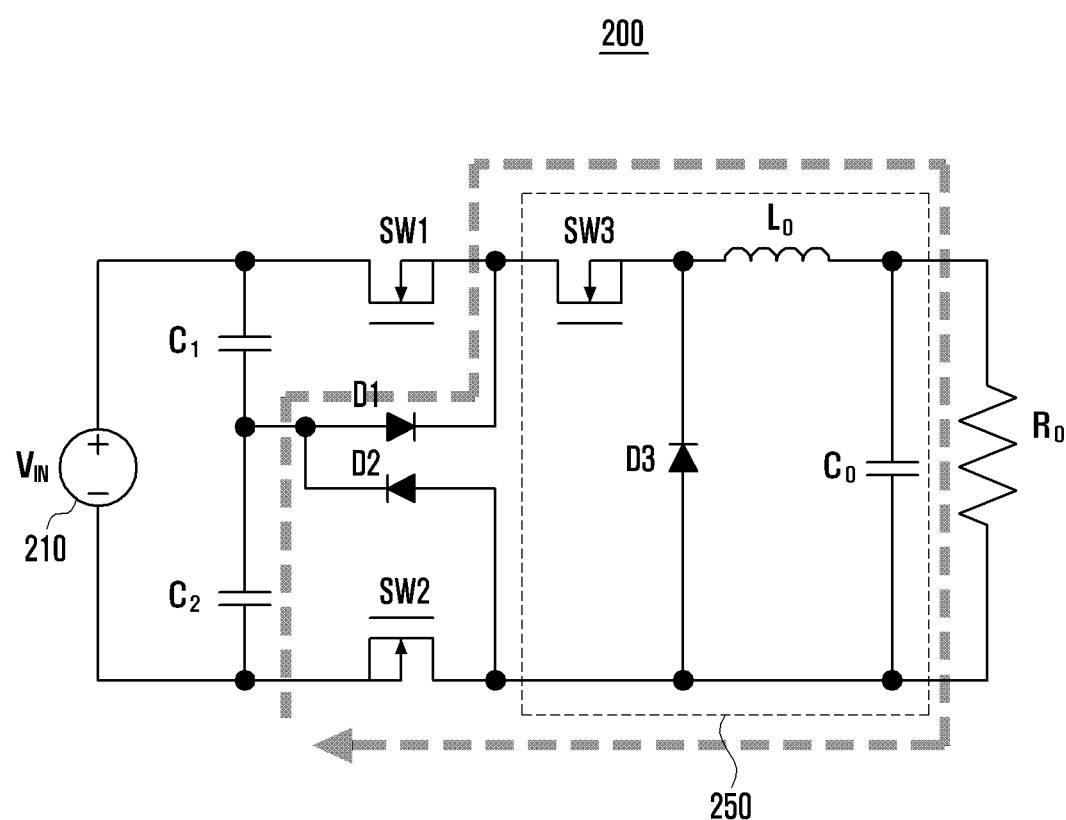
FIG. 8 illustrates a case in which a voltage of a first capacitor $C_1$ is less than a voltage of a second capacitor $C_2$ (VC1<VC2) in a power conversion device configured as in FIG. 6.

FIG. 7 illustrates a case in which a voltage of a first capacitor $C_1$ is greater than a voltage of a second capacitor $C_2$ (VC1>VC2) in a power conversion device configured as in FIG. 6. FIG. 8 illustrates a case in which a voltage of a first capacitor $C_1$ is less than a voltage of a second capacitor $C_2$ (VC1<VC2) in a power conversion device configured as in FIG. 6.

Referring to FIG. 7, in the power conversion device 200 according to various embodiments of the disclosure, in a case where a voltage of the first capacitor $C_1$ is greater than a voltage of the second capacitor $C_2$ (VC1>VC2), the first switch SW1 may be turned on and the second switch SW2 may be turned off. In this case, as the third switch SW3 is turned on, the voltage accumulated in the first capacitor $C_1$ may be supplied to the converter 250.

According to an embodiment, when the first switch SW1 and the third switch SW3 are turned on, a loop may be formed between the inductor $L_0$, the third capacitor $C_0$, the second diode D2, and the first capacitor $C_1$.

Referring to FIG. 8, in the power conversion device 200 according to various embodiments of the disclosure, in a case where a voltage of the first capacitor $C_1$ is less than a voltage of the second capacitor $C_2$ (VC1<VC2), the first switch SW1 may be turned off and the second switch SW2 may be turned on. In this case, as the third switch SW3 is turned on, the voltage accumulated in the second capacitor $C_2$ may be supplied to the converter 250.

According to an embodiment, when the second switch SW2 and the third switch SW3 are turned on, a loop may be formed between the first diode D1, the inductor $L_0$, the third capacitor $C_0$, and the second capacitor $C_2$.

According to an embodiment, in the power conversion device 200 illustrated in FIGS. 7 and 8, when the third switch SW3 is turned on, an electric current may flow through the inductor $L_0$, and a charge may be accumulated in the inductor $L_0$ and the third capacitor $C_0$. In this case, a cathode-side voltage of the third diode D3 becomes larger than an anode-side voltage thereof, so that no electric current may flow through the third diode D3.

Figure 9:
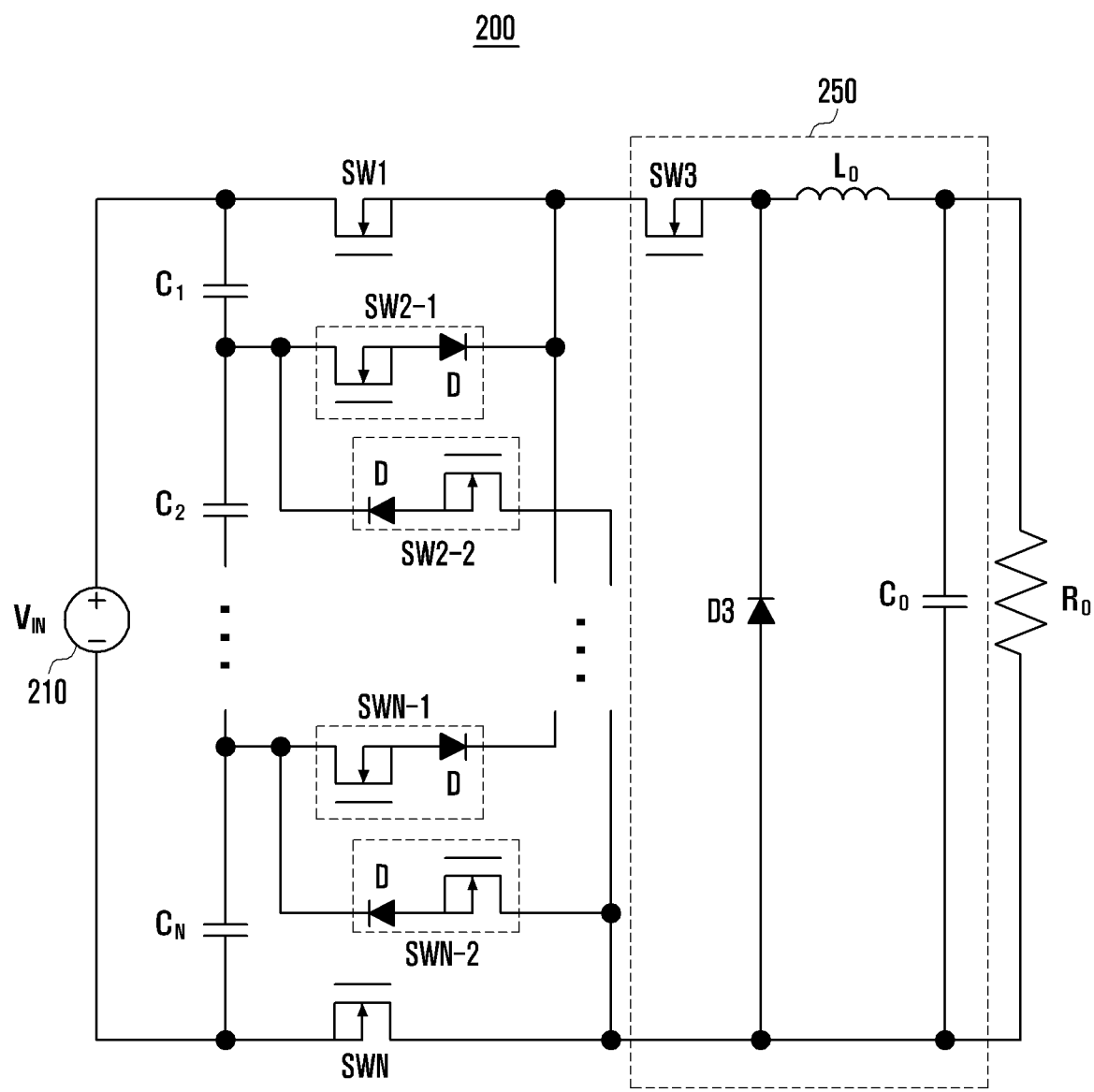
FIG. 9 illustrates a configuration of another example of a power conversion device according to various embodiments of the disclosure.

FIG. 9 illustrates a configuration of another example of a power conversion device according to various embodiments of the disclosure.

Referring to FIG. 8, in the power conversion device 200 according to various embodiments of the disclosure, a short-circuiting may occur, according to a power path configuration by one of the plurality of capacitors (e.g., the first capacitor $C_1$ to the N-th capacitor $C_N$), in the other switches (e.g., a second switch SW2-1 to a (N-2)th switch SWN-2) except for the first switch SW1 and the N-th switch SWN. Therefore, reverse diodes D may be connected to the other switches (e.g., the second switch SW2-1 to the (N-2)th switch SWN-2) except for the first switch SW1 and the N-th switch SWN, respectively.

Figure 10:
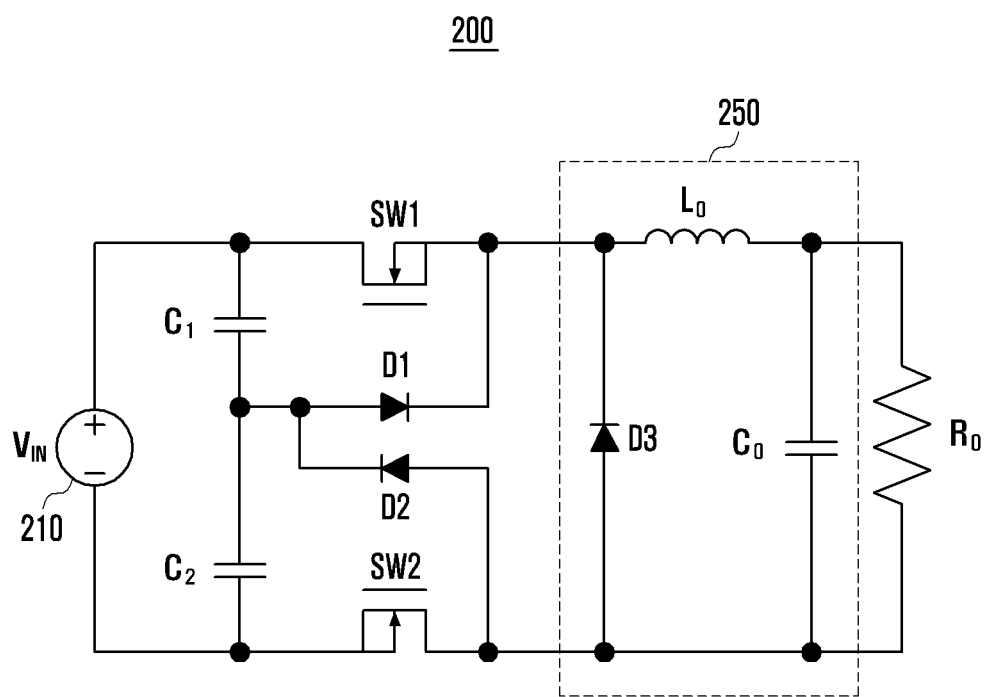
FIG. 10 illustrates a configuration of another example of a power conversion device according to various embodiments of the disclosure.

FIG. 10 illustrates a configuration of another example of a power conversion device according to various embodiments of the disclosure.

Referring to FIG. 10, the power conversion device 200 according to various embodiments of the disclosure may have a configuration which does not include the third switch SW3 in the converter 250 illustrated in FIG. 6.

According to an embodiment, in the power conversion device 200 illustrated in FIG. 10, in a case where a voltage of the first capacitor $C_1$ is greater than a voltage of the second capacitor $C_2$ (VC1>VC2), the first switch SW1 may be turned on and the second switch SW2 may be turned off. In this case, the voltage supplied through the first capacitor $C_1$ may be applied to the converter 250 through the first switch SW1.

According to an embodiment, in the power conversion device 200 illustrated in FIG. 10, in a case where a voltage of the first capacitor $C_1$ is less than a voltage of the second capacitor $C_2$ (VC1<VC2), the first switch SW1 may be turned off and the second switch SW2 may be turned on. In this case, the voltage supplied may be applied to the converter 250 through the second capacitor $C_2$ and the second switch SW2.

Figure 11:
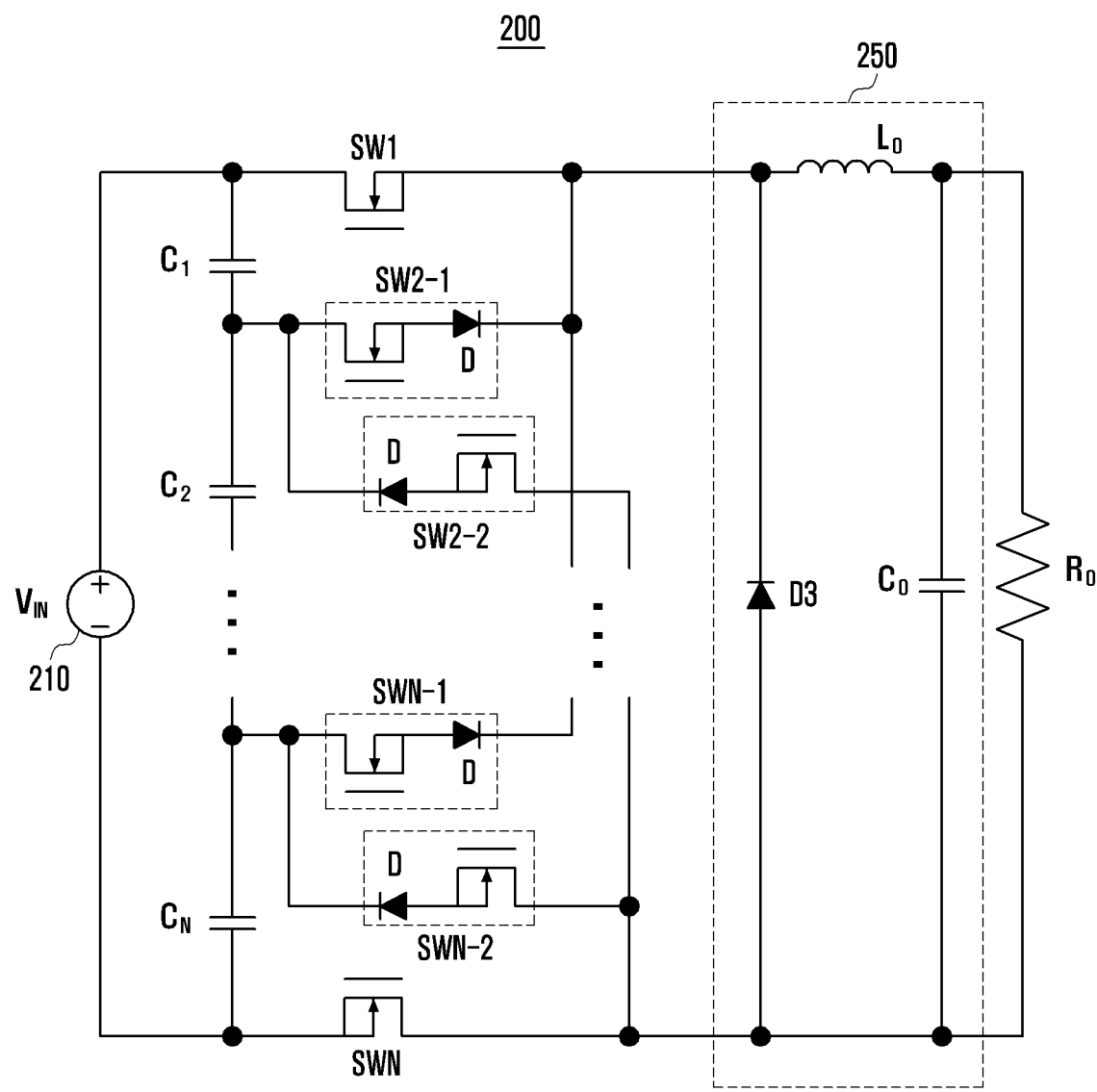
FIG. 11 illustrates a configuration of another example of a power conversion device according to various embodiments of the disclosure.

FIG. 11 illustrates a configuration of another example of a power conversion device according to various embodiments of the disclosure.

Referring to FIG. 11, the power conversion device 200 according to various embodiments of the disclosure may have a configuration which does not include the third switch SW3 in the converter 250 illustrated in FIG. 9.

According to an embodiment, in the power conversion device 200 illustrated in FIG. 10, a short-circuiting may occur, according to a power path configuration by one of the plurality of capacitors (e.g., the first capacitor $C_1$ to the N-th capacitor $C_N$), in the other switches (e.g., the second switch SW2-1 to the (N-2)th switch SWN-2) except for the first switch SW1 and the N-th switch SWN. Therefore, reverse diodes D may be connected to the other switches (e.g., the second switch SW2-1 to the (N-2)th switch SWN-2) except for the first switch SW1 and the N-th switch SWN, respectively. According to an embodiment, a reverse diode D may not be connected to a part of the other switches (e.g., the second switch SW2-1 to the (N-2)th switch SWN-2).

Figure 12:
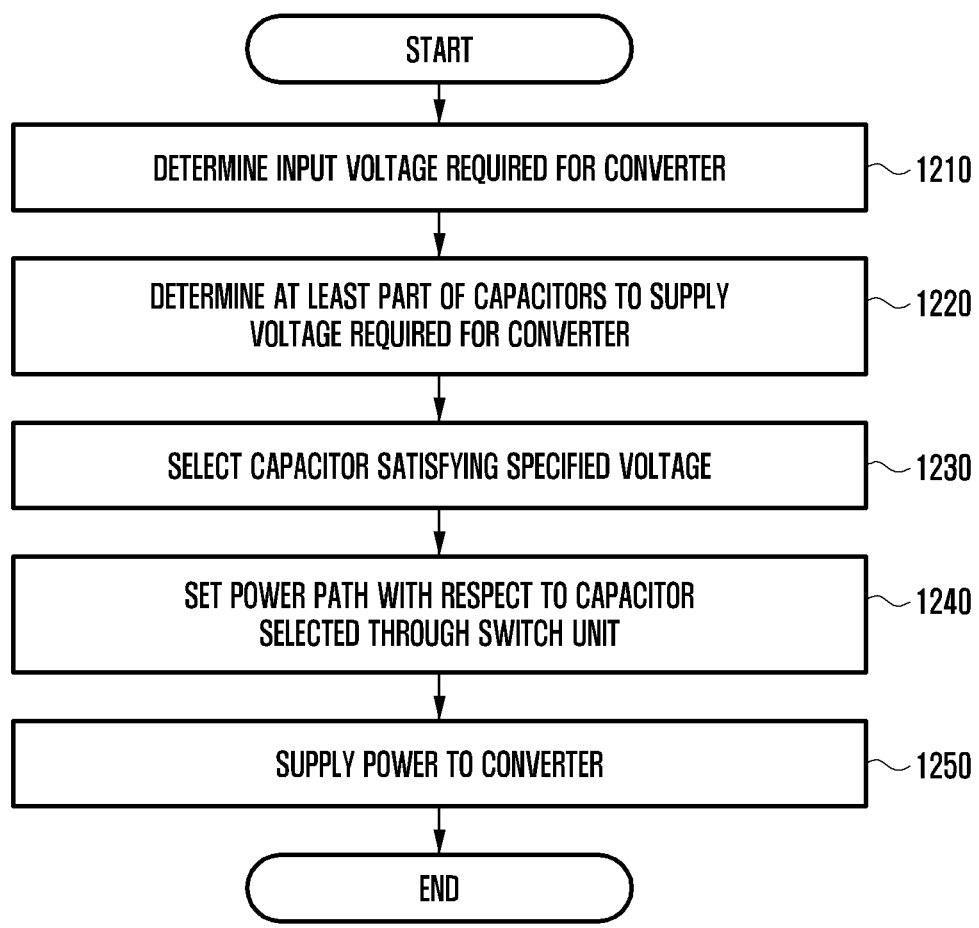
FIG. 12 is a flowchart illustrating an example of a power conversion method according to various embodiments of the disclosure.

FIG. 12 is a flowchart illustrating an example of a power conversion method according to various embodiments of the disclosure.

Operations 1210 to 1250 of FIG. 12 may be performed by, for example, the processor 120 of FIG. 1 or the controller 230 of the power conversion device 200 of FIG. 2. The components of FIGS. 1 to 10 may be used for the description of the operations 1210 to 1250. The operations 1210 to 1250 may be implemented by instructions which can be performed by the controller 230 of the power conversion device 200.

In operation 1210, the controller 230 may determine an input voltage required for the converter 250.

In operation 1220, the controller 230 may determine at least a part of the plurality of capacitors (e.g., the first capacitor 220-1, the second capacitor 220-2, . . . , and the N-th capacitor 220-N) included in the power conversion device 200, in order to supply a voltage required for the converter 250. For example, the at least a part of the capacitors may be a minimum number of capacitors for supplying a voltage required for the converter 250.

In operation 1230, the controller 230 may select a capacitor which satisfies a specified voltage (e.g., the highest voltage), among the determined at least a part of the capacitors, in order to supply a voltage required for the converter 250.

In operation 1240, the controller 230 may set a power path for supplying power to the converter 250 with respect to a capacitor selected through the switch unit 240.

In operation 1250, the controller 230 may supply power to the converter 250 by using a switch (e.g., one of the first switch 240-1, the second switch 240-2, . . . , and the N-th switch 240-N) which is turned on according to the setting of the power path.

Figure 13:
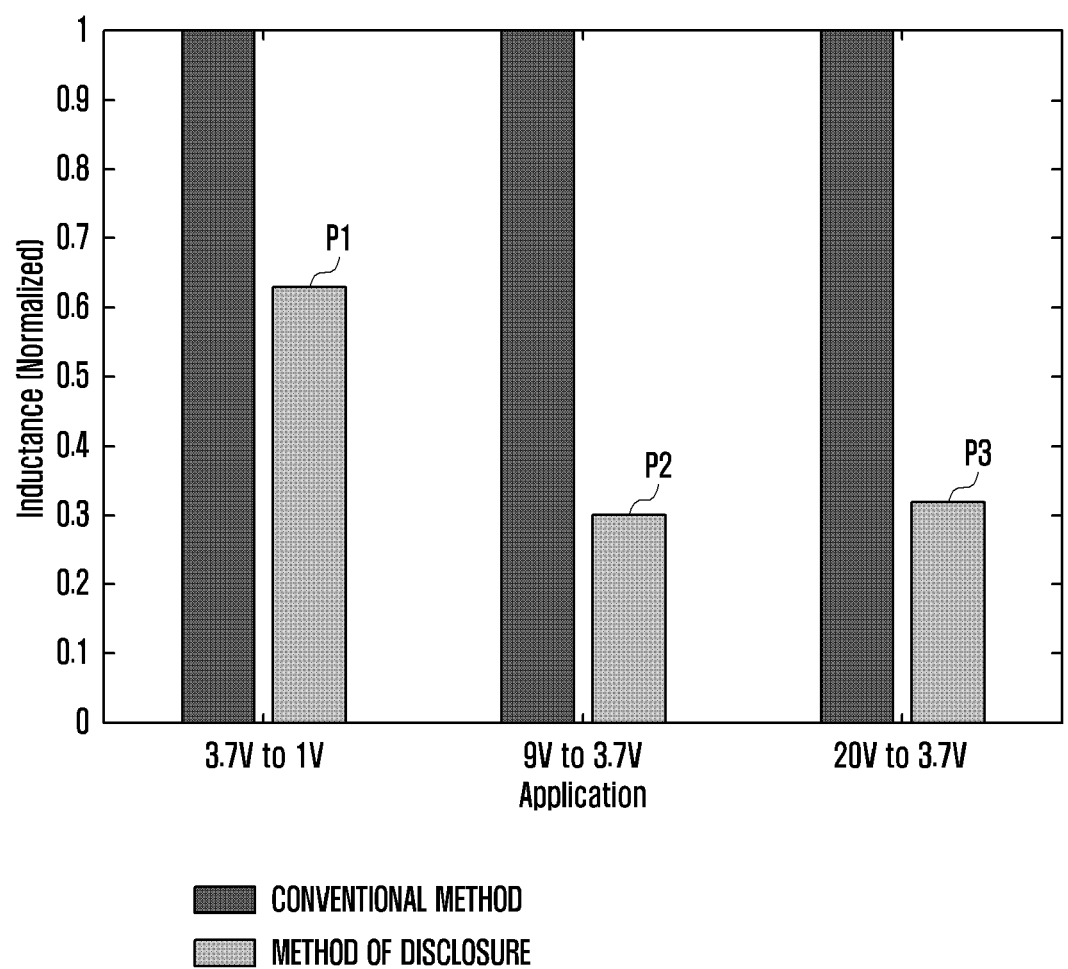
FIG. 13 illustrates a comparison of switching loss between a conventional power conversion device and a power conversion device according to various embodiments of the disclosure.

FIG. 13 illustrates a comparison of switching loss between a conventional power conversion device and a power conversion device according to various embodiments of the disclosure.

According to an embodiment, FIG. 13 shows schematic analysis of a switching loss reduction level, that is, a level of reducing inductance of the inductor $L_0$ of the converter 250 in the cases of applying the power conversion device 200 according to various embodiments of the disclosure to an application of dropping an input voltage of a lithium ion battery from about 3.7V to about 1V and an application of dropping an input voltage through a charger, to which a fast charging technology is applied, from about 5V-20V to about 3.7V.

Referring to FIG. 13, when the power conversion device 200 and the power conversion method according to various embodiments of the disclosure are used, in a case of stepping down from about 3.7V to about 1V, compared to the conventional method, the inductance can be lowered to about 40% as in P1. In addition, in the cases of stepping down from about 9V to about 3.7V and stepping down from about 20V to about 3.7V, the inductance can be lowered to about 70% as in P2 and P3.

When the power conversion device 200 and the power conversion method according to various embodiments of the disclosure are used, an input voltage of the converter 250 can be lowered to less than half, and thus switching loss can be lowered to at least about ½ or less.

In the above, although the disclosure has been described with reference to various embodiments, it is obvious to those skilled in the art that modifications and changes can be made thereto without departing from the technical spirit and scope of the disclosure.

The invention claimed is:

1. A power conversion device comprising:
   an input voltage source having a positive terminal and a negative terminal;
   a converter;
   a capacitor unit comprising a plurality of capacitors for accumulating an input voltage from the input voltage source, wherein the plurality of capacitors is connected in series across the positive terminal and the negative terminal;
   a switch unit connected to the capacitor unit and comprising a plurality of switches for selectively connecting at least one capacitor among the plurality of capacitors to the converter;
   a load electrically connected to the converter; and
   a controller connected to the capacitor unit and the switch unit,
   wherein the controller is configured to determine the at least one capacitor satisfying a specified condition, among the plurality of capacitors, set at least one switch among the plurality of switches, to be turned on, the at least one switch corresponding to the at least one capacitor, and set at least a part of other ones of the plurality of switches except for the at least one switch among the plurality of switches, to be turned off, so that the at least one capacitor and the converter are electrically connected and at least a part of the input voltage accumulated in the at least one capacitor is supplied to the converter,
   wherein the power conversion device further comprises:
   a feedback controller configured to provide a feedback signal to the converter, based on an input voltage of the load.

2. The power conversion device of claim 1, wherein each of the plurality of capacitors is configured to supply a voltage of a different level to the converter.

3. The power conversion device of claim 1, wherein the converter is configured to output a voltage stepped-down below the input voltage to the load, and the power conversion device further comprises at least one converter configured in parallel to the switch unit.

4. The power conversion device of claim 1, wherein the controller is configured to determine a capacitor having a largest accumulated voltage, among the plurality of capacitors, as the at least one capacitor satisfying the specified condition.

5. The power conversion device of claim 1, wherein the converter further comprises: an inductor and another capacitor configured to accumulate a charge supplied from the at least one capacitor; another switch configured to perform a switching operation for a voltage supplied from the at least one capacitor; and a diode configured to form a loop between the inductor and the another capacitor according to the switching operation of the another switch.

6. The power conversion device of claim 1, wherein the switch unit further comprises a plurality of reverse diodes connected to the plurality of switches.

7. An electronic device comprising:
   a converter;
   a power supply unit having a positive terminal and a negative terminal;
   a capacitor unit comprising a plurality of capacitors for accumulating an input voltage which is input through the power supply unit, wherein the plurality of capacitors is connected in series across the positive terminal and the negative terminal;
   a switch unit connected to the capacitor unit and comprising a plurality of switches for selectively connecting at least one capacitor among the plurality of capacitors to the converter;
   a load electrically connected to the converter; and
   a controller connected to the capacitor unit and the switch unit,
   wherein the controller is configured to determine the at least one capacitor satisfying a specified condition, among the plurality of capacitors, set at least one switch among the plurality of switches, to be turned on, the at least one switch corresponding to the at least one capacitor, and set at least a part of other switches of the plurality of switches except for the at least one switch among the plurality of switches, to be turned off, so that the at least one capacitor and the converter are electrically connected and at least a part of the input voltage accumulated in the at least one capacitor is supplied to the converter,
   wherein the electronic device further comprises:
   a feedback controller configured to provide a feedback signal to the converter, based on an input voltage of the load.

8. The electronic device of claim 7, wherein the controller is configured to determine a capacitor having a largest accumulated voltage, among the plurality of capacitors, as the at least one capacitor satisfying the specified condition.

9. The electronic device of claim 7, wherein the converter comprises an inductor and another capacitor configured to accumulate a charge supplied from the at least one capacitor.

10. The electronic device of claim 9, wherein the converter further comprises: another switch configured to perform a switching operation for a voltage supplied from the at least one capacitor; and a diode configured to form a loop between the inductor and the another capacitor according to the switching operation of the another switch.

11. A power conversion method comprising:
   determining, by a controller, an input voltage required for a converter electrically connected to a load;
   determining, by the controller, at least a part of a plurality of capacitors in order to supply a voltage required for the converter, wherein the plurality of capacitors is connected in series across a positive terminal and a negative terminal of a power supply unit;
   selecting, by the controller, a capacitor satisfying a specified voltage, among the determined at least the part of the plurality of capacitors;
   setting, by the controller, a power path for supplying power to the converter with respect to the capacitor selected through a switch unit;
   supplying power to the converter by using a switch which is turned on according to the setting of the power path; and
   providing, by a feedback controller, a feedback signal to the converter based on an input voltage of the load being electrically connected to the converter.

* * * * *